(12) United States Patent
Huang et al.

(10) Patent No.: US 11,139,353 B2
(45) Date of Patent: Oct. 5, 2021

(54) DISPLAY PANELS, DISPLAY DEVICES, AND METHODS FOR MANUFACTURING DISPLAY PANELS

(71) Applicant: YUNGU (GU'AN) TECHNOLOGY CO., LTD., Langfang (CN)

(72) Inventors: Jinlei Huang, Kunshan (CN); Xushen Wang, Kunshan (CN); Haofeng Zhang, Kunshan (CN); Jianping Chen, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/817,599

(22) Filed: Mar. 12, 2020

(65) Prior Publication Data

US 2020/0219950 A1     Jul. 9, 2020

Related U.S. Application Data

(63) Continuation of application No. PCT/CN2019/085063, filed on Apr. 29, 2019.

(30) Foreign Application Priority Data

Aug. 20, 2018 (CN) .......... 201810948119.X

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 51/0018* (2013.01); *H01L 51/0097* (2013.01);

(Continued)

(58) Field of Classification Search
None
See application file for complete search history.

(56) References Cited

U.S. PATENT DOCUMENTS

| 2002/0163300 A1 | 11/2002 | Duineveld et al. |
| 2005/0133802 A1* | 6/2005 | Lee ............... H01L 51/5284 |
| | | 257/95 |

(Continued)

FOREIGN PATENT DOCUMENTS

| CN | 204315576 U | 5/2015 |
| CN | 204361100 U | 5/2015 |

(Continued)

OTHER PUBLICATIONS

Definition of 'spongy' downloaded from URL< https://www.merriam-webster.com/dictionary/spongy> on Apr. 29, 2021. (Year: 2021).*

(Continued)

*Primary Examiner* — J. E. Schoenholtz
(74) *Attorney, Agent, or Firm* — Kilpatrick Townsend & Stockton

(57) ABSTRACT

The present disclosure provides a display panel, a display device, and a method for manufacturing the display panel. The display panel comprises an array substrate and a pixel-defining layer disposed on the array substrate. The pixel-defining layer has a plurality of pixel regions and defines a plurality of recesses non-overlapped with the plurality of pixel regions.

18 Claims, 9 Drawing Sheets

(52) U.S. Cl.
CPC ........ *H01L 51/56* (2013.01); *H01L 2227/323* (2013.01); *H01L 2251/5338* (2013.01)

(56) References Cited

U.S. PATENT DOCUMENTS

| | | | | |
|---|---|---|---|---|
| 2016/0155784 | A1* | 6/2016 | Park | H01L 27/3246 257/88 |
| 2016/0284774 | A1* | 9/2016 | Zhang | H01L 27/1218 |
| 2017/0125745 | A1 | 5/2017 | Lee et al. | |
| 2017/0229529 | A1 | 8/2017 | Jung et al. | |
| 2018/0005007 | A1 | 1/2018 | Du et al. | |
| 2018/0006271 | A1 | 1/2018 | Tang | |
| 2018/0076268 | A1 | 3/2018 | Wang et al. | |
| 2018/0366524 | A1* | 12/2018 | Bang | H01L 51/0011 |
| 2019/0013371 | A1* | 1/2019 | Kim | H01L 51/56 |
| 2019/0103418 | A1* | 4/2019 | Han | H01L 27/3246 |

FOREIGN PATENT DOCUMENTS

| | | |
|---|---|---|
| CN | 105845711 A | 8/2016 |
| CN | 105938873 A | 9/2016 |
| CN | 106910841 A | 6/2017 |
| CN | 206250196 U * | 6/2017 |
| CN | 206250196 U | 6/2017 |
| CN | 106920831 A | 7/2017 |
| CN | 107068726 A | 8/2017 |
| CN | 107092897 A | 8/2017 |
| CN | 107133613 A | 9/2017 |
| CN | 107134543 A | 9/2017 |
| CN | 206774550 U | 12/2017 |
| CN | 109065574 A | 12/2018 |
| CN | 109148531 A | 1/2019 |

OTHER PUBLICATIONS

Office Action of Chinese Patent Application No. 201810948119.X.
International Search Report of International Patent Application No. PCT/CN2019/085063.
CN First Office Action with search report dated Jan. 2, 2020 in the corresponding CN application (application No. 201810948119.x).

* cited by examiner

DISPLAY PANELS, DISPLAY DEVICES, AND METHODS FOR MANUFACTURING DISPLAY PANELS

CROSS-REFERENCES TO RELATED APPLICATIONS

This application is a continuation under 35 U.S.C. § 120 of international patent application PCT/CN2019/085063 filed on Apr. 29, 2019, which claims priority from Chinese Patent Application No. 201810948119.X, filed on Aug. 20, 2018 in the China National Intellectual Property Administration, the contents of both applications are hereby incorporated by reference.

TECHNICAL FIELD

The present disclosure relates to the field of display technology, and particularly to display panels, display devices using the display panels, and methods for manufacturing the display panels.

BACKGROUND

An organic light-emitting diode (OLED) display panel, also known as an organic electroluminescent display panel, has a broad application prospect as a new generation flat-panel display device due to its advantages of simple manufacturing process, low cost, low power consumption, high brightness, light weight, quick response, and easy to achieve a colored, large-scaled, and flexible display.

After the manufacture, the OLED display panel usually needs to undergo a series of reliability tests. An impact resistance of the screen is usually examined by a drop ball test. In such test and in a practical application, a stress surge phenomenon may occur at a local region of the display screen due to a transient impact, which may cause a display anomaly. Especially for a flexible screen that is transiently subjected to an impact, the stress increases sharply because there is no rigid protecting layer, and the display region is more likely to have a display defect, such as a black spot, a light spot, a color spot, and so on.

An additional buffer material is usually used to ameliorate the display anomalies caused by the impact, which, however, would increase a thickness of the display panel and decrease a bending capability of the display panel.

SUMMARY

Based on various embodiments, the present disclosure provides a display panel, a display device using the same, and a method for manufacturing the same.

The display panel includes an array substrate and a pixel-defining layer disposed on the array substrate. The pixel-defining layer has a plurality of pixel regions and defines a plurality of recesses non-overlapped with the plurality of pixel regions.

Optionally, the pixel-defining layer further has a plurality of non-pixel region surrounding the plurality of pixel regions, and the plurality of recesses are located in the non-pixel regions.

Optionally, shapes of projections of the plurality of recesses projected on the array substrate are selected from at least one of a circular shape, a square shape, a rectangular shape, and a rhombic shape.

Optionally, a diagonal length or a diameter of an opening of each of the plurality of recesses away from the array substrate is smaller than 1 μm.

Optionally, the display panel further includes a plurality of support members disposed on a region of the pixel-defining layer without the plurality of recesses.

Optionally, distance between each of the plurality of support members and one of the plurality of recesses adjacent to the support member is smaller than a distance between the support member and the pixel region adjacent to the support member.

Optionally, the plurality of recesses are grooves formed by patterning the pixel-defining layer, and the patterned pixel-defining layer includes side walls located between the grooves and the pixel regions adjacent to the grooves.

Optionally, a material of the pixel-defining layer is an organic polymer material.

Optionally, the organic polymer material is flexible.

Optionally, the plurality of recesses extend through or non-through the pixel-defining layer.

Optionally, the pixel-defining layer is a spongy structure.

Optionally, each of the pixel regions has a rectangular shape, and the plurality of recesses are located around each of the pixel regions.

Optionally, two of the side walls are located between two adjacent pixel regions, one or more groups of the grooves are located between the two side walls, and each group of the grooves includes one or more of the grooves aligned along a direction parallel to a corresponding side wall.

The display device includes the display panel as described in any one of the above embodiments.

The method for manufacturing the display panel includes: providing an array substrate; forming a pixel-defining layer having a plurality of pixel regions on the array substrate; and forming a plurality of recesses on the pixel-defining layer, wherein the plurality of recesses are not overlapped with the pixel regions.

Optionally, the array substrate comprises a base substrate and a TFT array substrate disposed on the base substrate.

Optionally, the forming the pixel-defining layer having the plurality of pixel regions on the array substrate includes: forming a pixel-defining layer on the array substrate; defining the plurality of pixel openings in the pixel-defining layer through photolithography, the pixel-defining layer is divided into a plurality of pixel regions corresponding to the plurality of pixel openings and a plurality of non-pixel regions surrounding the plurality of pixel regions; and depositing different colored light emitting layer materials into the pixel openings to form different colored pixels.

Optionally, the plurality of recesses are formed by a dry etching method, a wet etching method, or a laser cauterizing method.

Optionally, the plurality of recesses and the plurality of pixel openings are formed in a same etching process using a same mask.

BRIEF DESCRIPTION OF THE DRAWINGS

In order to better describe and illustrate embodiments and/or examples of the present disclosure, references can be made to one or more drawings. The additional details or examples used to describe the drawings should not be construed as limiting the scope of any of the present disclosure, the presently described embodiments and examples, and the presently understood best modes of the present disclosure.

DETAILED DESCRIPTION OF THE INVENTION

For a clear understanding of the technical features, objects and effects of the present disclosure, specific embodiments of the present disclosure will now be described in detail with reference to the accompanying drawings. The following description is merely exemplary embodiments of the present disclosure, and is not intended to limit the scope of the present disclosure.

In the drop ball test, the conventional display device tends to have display defects, such as the black pot, the bright spot, the color spot, and so on, which are unable to be recovered, which greatly influences the display performance of the electronic device. It has been found that a stress surge may occur at a struck region of the display panel that is subjected to a transient impact. If the display panel cannot immediately dissipate or absorb the stress, the problem that a component at the struck region is damaged or films or layers are separated will occur. An additional buffer material is usually used to ameliorate the display anomalies, which, however, will increase the thickness of the display panel and decrease the bending capability of the display panel.

Based on this, the present disclosure provides a display panel. The display panel includes an array substrate and a pixel-defining layer disposed on the array substrate. The array substrate includes a base substrate and a thin film transistor (TFT) disposed on the base substrate. The pixel-defining layer has a plurality of pixel regions and a non-pixel region surrounding each of the plurality of pixel regions. The pixel-defining layer defines a plurality of recesses in the non-pixel region, and each of the plurality of recesses is located completely outside of the plurality of pixel regions (i.e. none of the plurality of recesses is overlapped with the plurality of pixel regions). When the display panel is subjected to a transient impact, the stress that is transiently increased can be dissipated and released via an inner sidewall of the recess, thereby avoiding damage to the display components in the pixel region and the display defects such as the black pot, bright spot, color spot, and so on, increasing an impact resistance of the display panel, and protecting the pixel region from being damaged by the external impact.

In order to make the above objects, features and advantages of the present application more apparent and better understood, embodiments of the application will be fully described hereinafter with reference to the drawings. Numerous specific details are set forth in the following description in order to provide a thorough understanding of the present application. However, the present application can be implemented in many other ways different from those described herein, and a person skilled in the art can make similar modifications without departing from the application, and therefore, the present application is not limited by the specific embodiments disclosed below.

Figure 1:
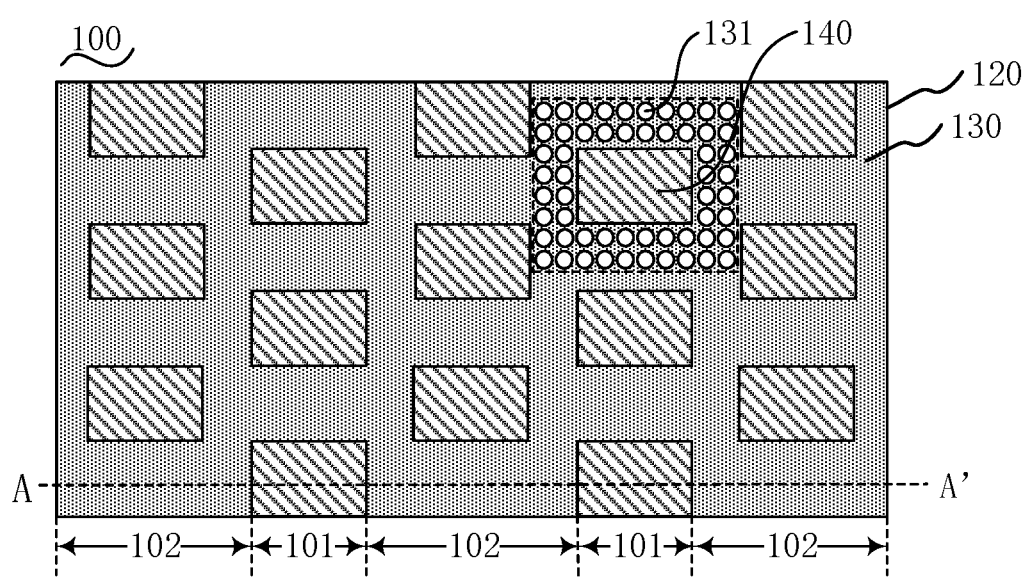
FIG. 1 is a schematic top view of a display panel in an embodiment of the present disclosure.
Figure 2:
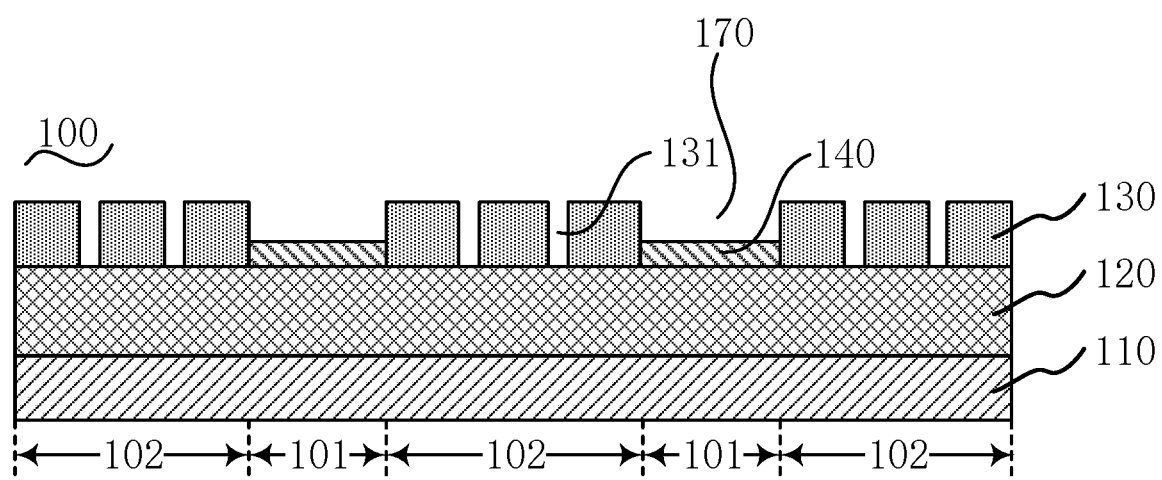
FIG. 2 is a schematic cross-sectional view along the A-A' line in FIG. 1.

FIG. 1 is a schematic top view of a display panel in an embodiment of the present disclosure. FIG. 2 is a schematic cross-sectional view along the A-A' line in FIG. 1. Referring to FIG. 1 and FIG. 2, a display panel 100 provided in an embodiment of the present disclosure includes a base substrate 110, a thin film transistor (TFT) array substrate 120, and a pixel-defining layer 130 stacked in sequence from bottom to top. The pixel-defining layer 130 defines a plurality of pixel openings 170. The pixel-defining layer 130 has a plurality of pixel regions 101 and a plurality of non-pixel regions 102 surrounding the plurality of pixel regions 101. The plurality of pixel regions 101 correspond to the plurality of pixel openings 170 in a one-to-one manner. Light emitting layer materials configured to emit lights with different colors can be deposited via evaporation in the plurality of pixel openings 170 respectively, so as to form a plurality of pixels 140 emitting lights with different colors. A plurality of recesses 131 are provided within the non-pixel region 102 around the pixel region 101. Each of the plurality of recesses 131 is located completely outside the pixel region 101, that is, none of the plurality of recesses 131 is overlapped with the plurality of pixel regions 101. It is to be understood that the shapes and the arrangement of the plurality of recesses 131 are not limited to those shown in FIG. 1 and FIG. 2, but can be varied and combined in various ways. Moreover, the plurality of pixel regions 101 can be arranged in various ways, for example, in an array form, or in a staggered form. The pixel 140 located within the pixel region 101 can be one of the three primary colored pixels or one of the four primary colored pixels, which is not limited herein.

By providing the recess 131 located around the pixel region 101, the display panel 100 can dissipate and release the transiently increased stress when being subjected to an external impact, so that the impact resistance of the display panel 100 is increased and the purpose of protecting the pixel region 101 from being damaged by the external impact is achieved. In addition, an additional buffer material is not required in the display panel 100, so that the bending capability of the display panel 100 can be increased without increasing the thickness of the display panel 100.

Optionally, as shown in FIG. 2, the recess 131 can be located around the pixel region 101. The recess 131 can be disposed at a peripheral area of the pixel region 101, that is, the recess 131 can be disposed in the non-pixel region 102 to protect the pixel 140 in the pixel region 101 from being damaged by an impact. One or more recesses 131 can be located around the pixel region 101. A location of the recess 131 can be selected according to a practical process or a specific product and is not limited herein. By providing the recess 131 surrounding the pixel region 101, the display panel 100 can dissipate and release the transiently increased stress promptly in the recess 131 located around the pixel region 101, thereby protecting the pixel in the pixel region 101 from being damaged by the stress.

Optionally, a shape of the recess 131 projected onto the array substrate can be a circular shape, a square shape, a rectangular shape, a rhombic shape, or other shapes. Accordingly, the recess 131 can be shaped into a round hole, a cubic recess, a cuboid recess, or a prismatic recess. The plurality of recesses 131 can have the same shape or a combination of different shapes selected from the above-described shapes. Optionally, as shown in FIG. 2, the recess 131 located around the pixel region 101 can be shaped into a round hole. By shaping the recess 131 into a commonly used configuration, the manufacturing process can be simpler and the solution of the present disclosure is easier to be implemented.

Optionally, an opening of the recess 131 away from the array substrate can have a diagonal length or diameter smaller than 1 μm. Referring to FIG. 1 and FIG. 2, the opening of the recess 131 away from the array substrate is shown in FIG. 1 as a circle defined by the pixel-opening layer. Optionally, a shape of the opening of the recess 131 away from the array substrate can have a maximum size smaller than 1 μm. Optionally, the maximum size can be about 0.51 μm. A plurality of small-sized recesses 131 can be arranged as dense as possible. By providing the small-size recess 131, a material of a layer or film (if any) subsequently and directly formed on the pixel-defining layer 130 can be prevented from being filled in the recess 131 to make the recess 131 ineffective for the stress dissipation and release. Optionally, the recess 131 shaped into a round hole can have a diameter smaller than 1 μm. Optionally, the recess 131 shaped into a cubic recess, a cuboid recess, or a prismatic recess can have a square, rectangular, or rhombic opening with a diagonal length smaller than 1 μm. By arranging the plurality of recesses 131 densely, the pixel-defining layer can have a spongy structure to dissipate and release the transient stress promptly, thereby protecting the pixel from being damaged.

Figure 3:
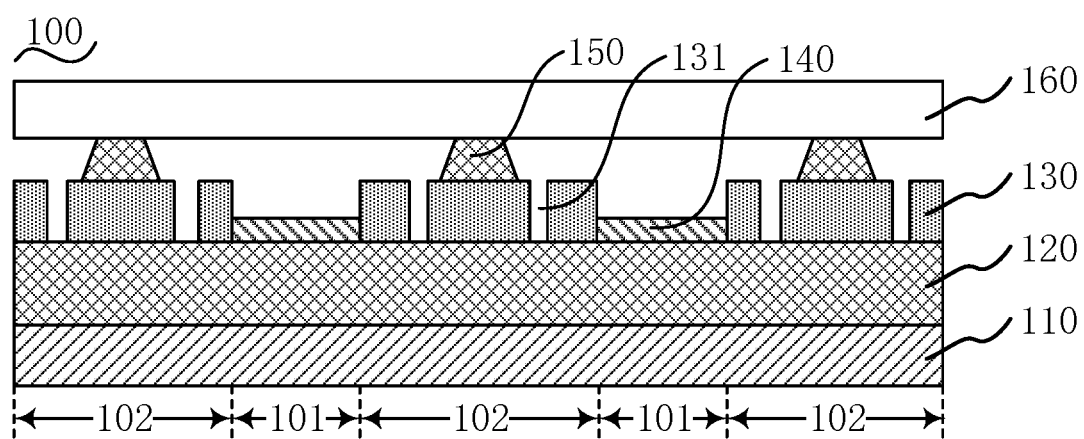
FIG. 3 is a schematic cross-sectional view of the display panel in another embodiment.

Optionally, as shown in FIG. 3, the display panel 100 includes the base substrate 110, the TFT array substrate 120, the pixel-defining layer 130, the pixel 140, a plurality of support members 150, and an encapsulation layer 160. The support member 150 is located on a region of the pixel-defining layer 130 without the recesses 131. The encapsulation layer 160 covers the plurality of support members 150 from a side of the plurality of support members 150 away from the pixel-defining layer 130. The support member 150 can be disposed on a region of pixel-defining layer 130 located between two adjacent pixels 140 to support the encapsulation layer 160. The support member 150 can be made of a rigid material, such as silicon nitride, silicon oxide, and so on, or can be made of a flexible material, such as a flexible organic polymer material. If a transient impact is applied on the encapsulation layer 160, a stress caused by the transient impact will be transferred to the pixel-defining layer 130 via the support member 150 and dissipated in the recess 131, thereby avoiding the damage to the pixel 140 caused by the impact.

Optionally, the recesses 131 are grooves 1313 formed by patterning the pixel-defining layer 130. Optionally, the pixel-defining layer 130 can be formed into a structure with an ordered pattern through a patterning process including such as light exposure and development. The patterned pixel-defining layer 130 can have a plurality of side walls each located between the corresponding groove 1313 and pixel region 101. The side wall can protect the pixel 140 well from being damaged by a stress caused by an impact. Optionally, the side wall can have a thickness from about 2 μm to about 6 μm.

Figure 4:
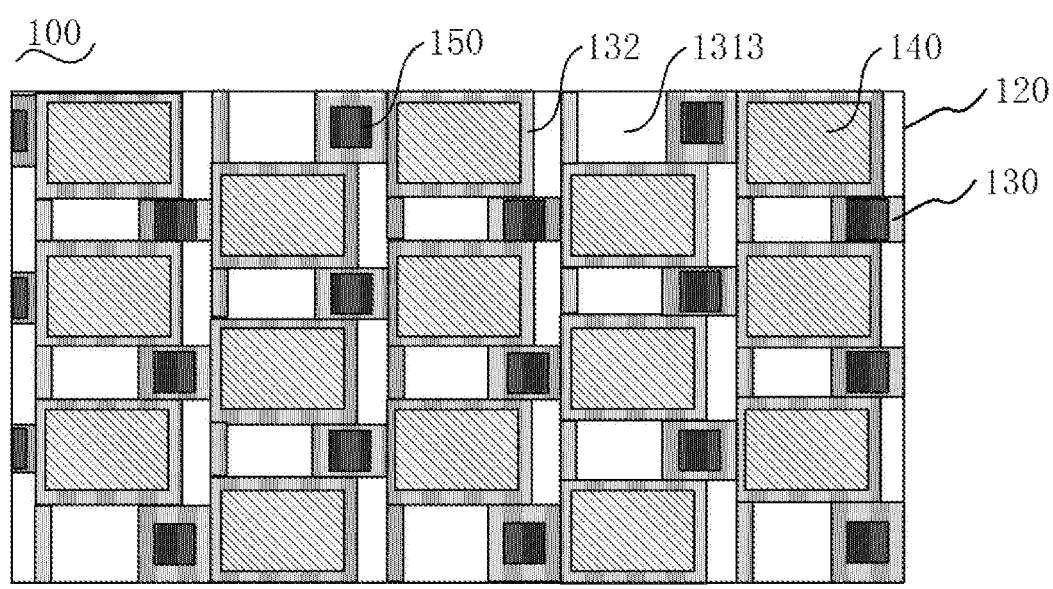
FIG. 4 is a schematic top view of the display panel in another embodiment.
Figure 5:
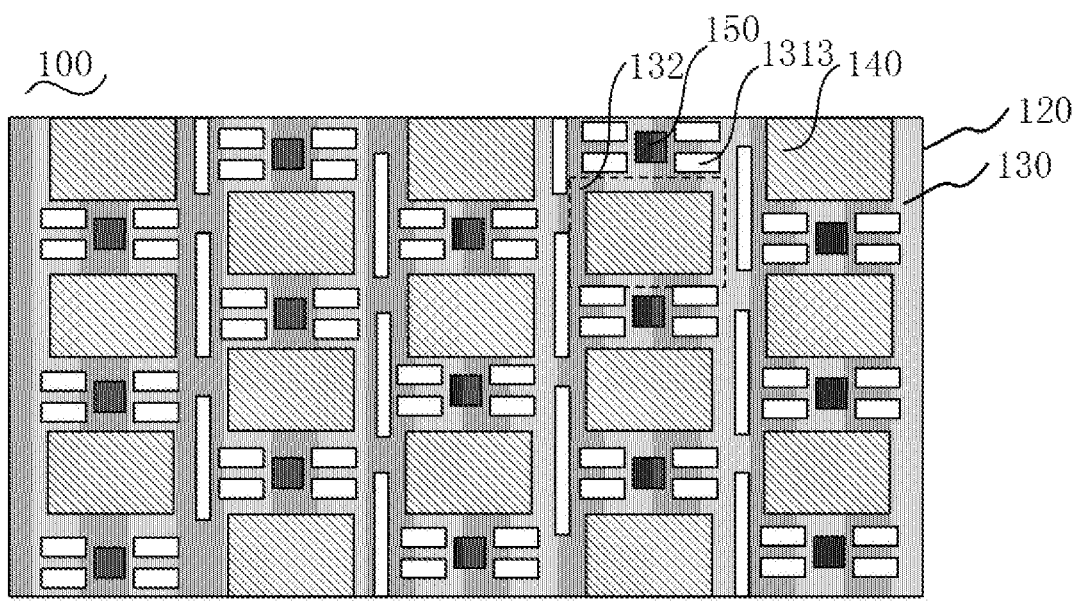
FIG. 5 is a schematic top view of the display panel in yet another embodiment.

The plurality of patterned grooves 1313 can have various cross-sectional shapes and can be arranged around each pixel 140 in various configurations. Optionally, as shown in FIG. 4 and FIG. 5, the groove 1313 has a relatively large opening, and the plurality of grooves 1313 are sparsely distributed. The grooves 1313 have regular shapes which mainly are rectangular shapes. A side wall 132, which is a portion of the pixel-defining layer 130, is located between the pixel 140 and the grooves 1313. One, two, or more groups of grooves are located between two side walls 132 between two adjacent pixels 140. Each group of grooves includes one, two, or more grooves 1313 aligned along a direction parallel to the corresponding side wall 132.

Optionally, besides the portions of the pixel-defining layer 130 formed into the grooves 1313, the pixel-defining layer 130 retains portions to have the plurality of support members 150 disposed thereon. Optionally, each support member 150 is disposed between two adjacent grooves 1313. The support members 150 support a layer or film located on the pixel-defining layer 130 to prevent the layer or film from being deposited into the grooves 1313.

By patterning the pixel-defining layer 130 to form the plurality of the grooves 1313, an deformation of the inorganic layer caused by the stress when a transient impact is applied on the display panel 100 can be inductively released to the grooves 1313 located between side walls 132 and thus cannot transferred to the pixels 140, thereby improving the impact resistance of the display panel 100 and protecting the pixel region 101 from being damaged by the external impact.

Figure 6:
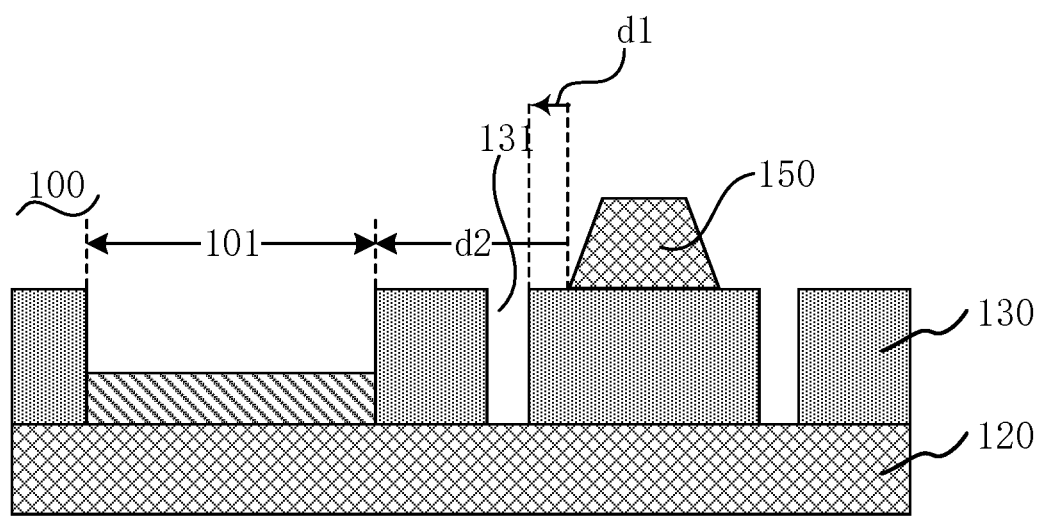
FIG. 6 is an enlarged cross-sectional view of a location region of the display panel in an embodiment.

Optionally, as shown in FIG. 6, a distance d1 between each support member 150 and the recess 131 adjacent to the support member 150 is smaller than a distance d2 between the support member 150 and the pixel region 101 adjacent to the support member 150; that is, each recess 131 is located between the support member 150 and the pixel region 101 adjacent to the support member 150. As such, a stress caused by a transient impact on the display panel 100 can be dissipated promptly via the recess 131 to prevent the transfer of the stress to the pixel 140. The recesses 131 can be a plurality of small holes distributed densely as shown in FIG. 1 or a plurality of large grooves 1313 distributed sparsely as shown in FIG. 4 and FIG. 5.

Figure 7:
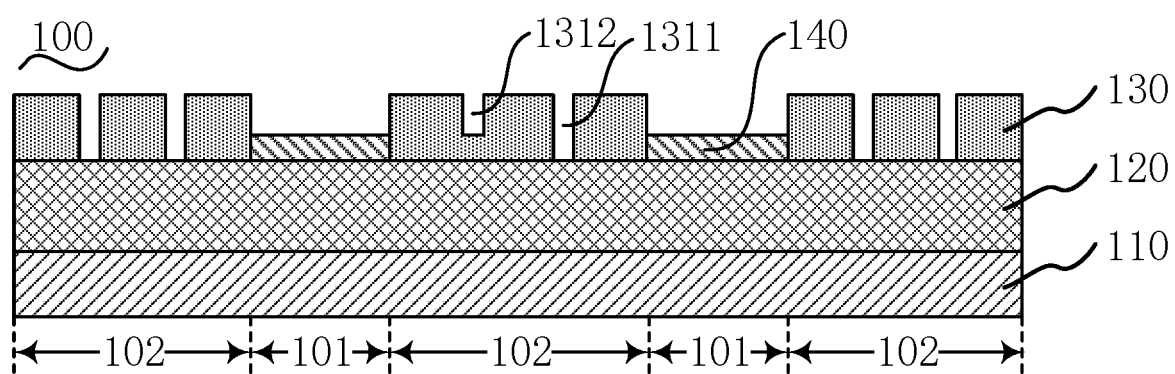
FIG. 7 is a schematic cross-sectional view of the display panel in yet another embodiment.

Optionally, as shown in FIG. 7, the recess 131 can extend through or not extend through the pixel-defining layer 130 to form a through recess 1311 or a non-through recess 1312 as shown in FIG. 7. Optionally, depths of the recesses 131 in the pixel-defining layer 130 can be the same, partially different, or totally different. The depths of the recesses 131 can be selected according to needs or practical manufacturing process and are not limited herein.

Optionally, the pixel-defining layer 130 is made of an organic polymer material, such as photosensitive polyimide (PSPI). The photosensitive polyimide is a photosensitive and heat-resistant photoresist and has good heat-resistance, corrosion-resistance, and insulativity. The organic polymer material used for forming the pixel-defining layer 130 can have an appropriate flexibility to release a portion of the stress, which is conducive to reduce the damage of the display panel 100 caused by a transiently surged stress.

Figure 8:
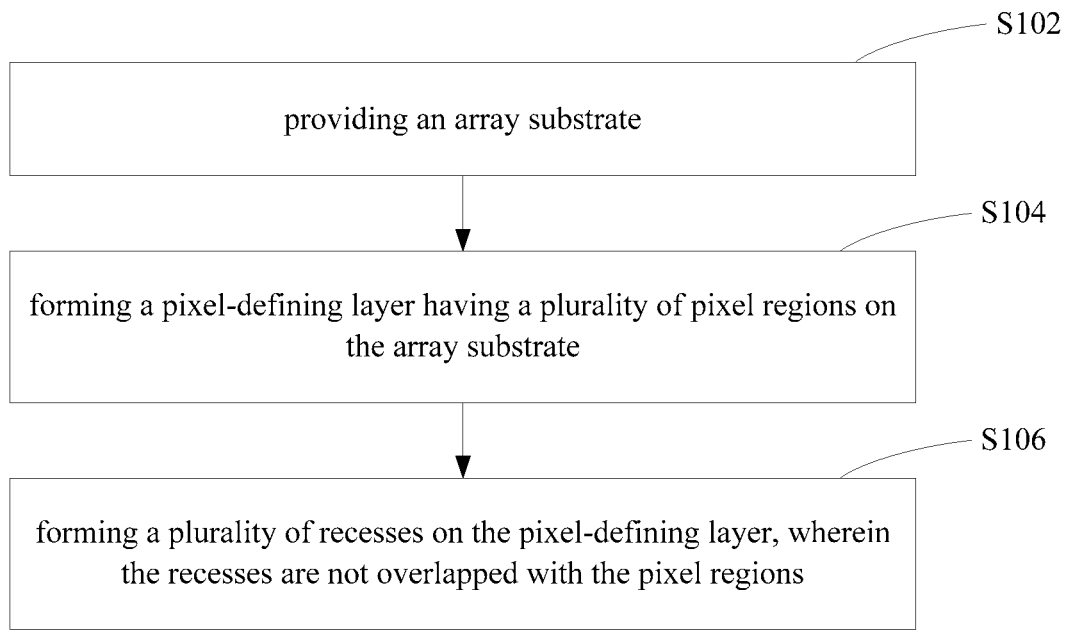
FIG. 8 shows a flowchart of a method for manufacturing the display panel in an embodiment.

In some embodiments, a method for manufacturing the display panel is provided. As shown in FIG. 8, the method include the steps of:

S102, providing the array substrate;

S104, forming the pixel-defining layer having the plurality of pixel regions on the array substrate; and S106, forming the plurality of recesses on the pixel-defining layer, wherein the recesses are not overlapped with the pixel regions.

In the S102, the array substrate can include a base substrate and a TFT array substrate located on the base substrate. Optionally, the array substrate is a combination of a glass base substrate or a flexible base substrate and the TFT array substrate.

Figure 9:
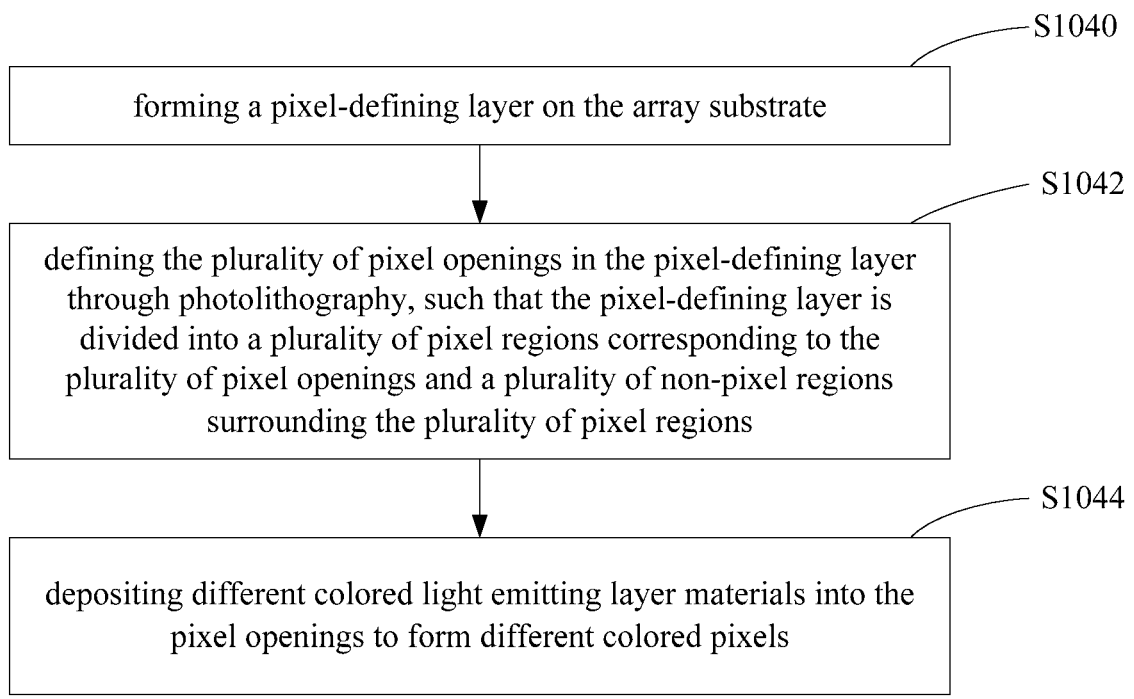
FIG. 9 shows a flowchart of S104 of the method shown in FIG. 8.

As shown in FIG. 9, the S104 can specifically include:

S1040, forming a pixel-defining layer on the array substrate;

S1042, defining the plurality of pixel openings in the pixel-defining layer through photolithography, such that the pixel-defining layer is divided into the plurality of pixel regions corresponding to the plurality of pixel openings and the plurality of non-pixel regions surrounding the plurality of pixel regions; and S1044, depositing different colored light emitting layer materials into the pixel openings to form different colored pixels.

In the S106, the plurality of recesses can be formed within the non-pixel regions of the pixel-defining layer. The recess can be located around the pixel region to protect the pixel disposed in the pixel region from being damaged by an impact. The recess can be formed by an etching method or a laser radiation method, such as a dry etching method, a wet etching method, or a laser cauterizing method. Optionally, the recess and the pixel opening are formed in a same etching process using a same mask to save cost.

The display panel manufactured by the above-described method has a high impact resistance. No additional buffer material is required for the display panel. The method is simple and cost-effective. The pixel region can be well protected in the display panel when the display panel is subjected to an external impact, thereby avoiding the display failure of the display panel.

A display device is further provided in an embodiment of the present disclosure. The display device includes the display panel described in any one of the embodiments. The display device can be any product or component capable of displaying images, such as a mobile phone, a tablet computer, a television, a displayer, a laptop, a digital photo frame, a navigator, a smart wearable device. The display panel and the display device have high reliabilities and are less likely to have display defects such as black spot, light spot, and color spot when being impacted. Other components of the display device are well known for those skilled in the art and will not be repeated herein.

The technical features of the above-described embodiments may be arbitrarily combined. In order to make the description simple, not all possible combinations of the technical features in the above embodiments are described. However, as long as there is no contradiction in the combination of these technical features, the combinations should be in the scope of the present disclosure.

What described above are only several implementations of the present disclosure, and these embodiments are specific and detailed, but not intended to limit the scope of the present disclosure. It should be understood by the skilled in the art that various modifications and improvements can be made without departing from the conception of the present disclosure, and all fall within the protection scope of the present disclosure. Therefore, the patent protection scope of the present disclosure is defined by the appended claims.

The invention claimed is:

1. A display panel, comprising
an array substrate;
a pixel-defining layer disposed on the array substrate; and
a plurality of support members configured to transfer stress within the display panel;
wherein the pixel-defining layer comprises a plurality of pixel regions and defines a plurality of recesses being separate from the plurality of pixel region; and
wherein a distance between each of the plurality of support members and one of the plurality of recesses adjacent to the support member is smaller than a distance between the support member and the pixel region adjacent to the support member.

2. The display panel of claim 1, wherein the pixel-defining layer further comprises a plurality of non-pixel regions surrounding the plurality of pixel regions, the plurality of recesses being located in the non-pixel regions.

3. The display panel of claim 1, wherein shapes of projections of the plurality of recesses on the array substrate are selected from at least one of a circular shape, a square shape, a rectangular shape, and a rhombic shape.

4. The display panel of claim 3, wherein a diagonal length or a diameter of an opening of each of the plurality of recesses away from the array substrate is smaller than 1 µm and greater than zero.

5. The display panel of claim 1, wherein the plurality of support members are disposed on a region of the pixel-defining layer without the plurality of recesses.

6. The display panel of claim 1, wherein the plurality of recesses are grooves formed by patterning the pixel-defining layer, and the patterned pixel-defining layer comprises side walls located between the grooves and the pixel regions adjacent to the grooves.

7. The display panel of claim 1, wherein a material of the pixel-defining layer is an organic polymer material.

8. The display panel of claim 7, wherein the organic polymer material is flexible.

9. The display panel of claim 1, wherein the plurality of recesses extend through or non-through the pixel-defining layer.

10. The display panel of claim 1, wherein the pixel-defining layer is a spongy structure.

11. The display panel of claim 1, wherein each of the pixel regions has a rectangular shape, and the plurality of recesses are located around each of the pixel regions.

12. The display panel of claim 6, wherein two of the side walls are located between two adjacent pixel regions, one or more groups of the grooves are located between the side walls, and each group of the grooves comprises one or more of the grooves aligned along a direction parallel to a corresponding side wall.

13. A display device, comprising a display panel, the display panel comprising:
an array substrate;
a pixel-defining layer disposed on the array substrate; and
a plurality of support members configured to transfer stress within the display panel;
wherein the pixel-defining layer comprises a plurality of pixel regions and defines a plurality of recesses non-overlapped with the plurality of pixel regions; and
wherein each of the plurality of recesses is configured between the support member and the pixel region adjacent to the support member for enhanced impact resistance of the display panel.

14. A method for manufacturing a display panel, comprising:
providing an array substrate;
forming a pixel-defining layer having a plurality of pixel regions on the array substrate; and
forming a plurality of recesses on the pixel-defining layer, wherein the plurality of recesses are separate from the pixel regions;

wherein each of the plurality of recesses is configured between a support member and the pixel region adjacent to the support member.

15. The method of claim 14, wherein the array substrate comprises a base substrate and a thin film transistor array substrate disposed on the base substrate.

16. The method of claim 14, wherein the forming the pixel-defining layer having the plurality of pixel regions on the array substrate comprises:
   forming a pixel-defining layer on the array substrate;
   defining the plurality of pixel openings in the pixel-defining layer through photolithography, the pixel-defining layer is divided into a plurality of pixel regions corresponding to the plurality of pixel openings and a plurality of non-pixel regions surrounding the plurality of pixel regions; and
   depositing different colored light emitting layer materials into the pixel openings to form different colored pixels.

17. The method of claim 14, wherein the plurality of recesses is formed by a dry etching method, a wet etching method, or a laser cauterizing method.

18. The method of claim 16, wherein the plurality of recesses and the plurality of pixel openings are formed in a same etching process using a same mask.

* * * * *